(12) United States Patent
Loeffelholz et al.

(10) Patent No.: US 7,563,996 B2
(45) Date of Patent: *Jul. 21, 2009

(54) PLUG CONNECTOR FOR CABLE TELEVISION NETWORK AND METHOD OF USE

(75) Inventors: Todd A. Loeffelholz, Minnetonka, MN (US); Terry E. McClellan, Maple Grove, MN (US); Sara Manderfield, Saint Paul, MN (US); Zakhary Bluband, Minnetonka, MN (US); Par G. Peterson, Eden Praire, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 77 days.

This patent is subject to a terminal disclaimer.

(21) Appl. No.: 11/800,062

(22) Filed: May 2, 2007

(65) Prior Publication Data
US 2008/0047807 A1 Feb. 28, 2008

Related U.S. Application Data

(60) Continuation of application No. 11/343,905, filed on Jan. 31, 2006, now Pat. No. 7,230,192, which is a continuation of application No. 11/095,132, filed on Mar. 30, 2005, now Pat. No. 7,135,649, which is a continuation of application No. 10/777,694, filed on Feb. 12, 2004, now Pat. No. 6,888,078, which is a continuation of application No. 10/330,450, filed on Dec. 27, 2002, now Pat. No. 6,720,841, which is a division of application No. 09/780,585, filed on Feb. 9, 2001, now Pat. No. 6,545,562.

(51) Int. Cl.
*H01P 1/10* (2006.01)

(52) U.S. Cl. .............. 200/51 R; 200/51.09; 200/51.07; 333/100; 439/170; 439/955

(58) Field of Classification Search .............. 200/51 R, 200/51.02–51.13; 333/100, 105, 111, 260; 439/78, 79, 170, 188, 578, 955; 455/78, 455/79
See application file for complete search history.

(56) References Cited

U.S. PATENT DOCUMENTS

| 4,749,968 A | 6/1988 | Burroughs |
| 4,798,542 A | 1/1989 | Asick et al. |

(Continued)

OTHER PUBLICATIONS

Communication Associates, JXP Short Orange 75 Ohm 1200 MHz (0.45"), web page, 4 pages (Apr. 9, 2002).
RF Product list for Communication Associates Product No. CA007520 at www.communicationassociates.com.

*Primary Examiner*—Michael A Friedhofer
(74) *Attorney, Agent, or Firm*—Merchant & Gould P.C.

(57) ABSTRACT

A telecommunications apparatus for use with a plug having at least first, second and third pins. The telecommunications apparatus includes a plug connector for receiving the plug. The plug connector includes at least first, second and third electrical contacts for electrically contacting the first, second and third pins, respectively, when the plug is inserted in the plug connector. The plug connector also includes an electrical by-pass pathway that: i) electrically connects the first and second electrical contacts when the plug is fully removed from the plug connector such that a signal can enter the plug connector through the first contact, pass through the by-pass pathway to the second contact, and exit the plug connector through the second contact; and ii) does not electrically connect the first and second electrical contacts when the plug is fully inserted within the plug connector such that a signal can enter the plug connector through the first contact, pass through the plug to the second contact, and exit the plug connector through the second contact.

35 Claims, 16 Drawing Sheets

U.S. PATENT DOCUMENTS

| | | | |
|---|---|---|---|
| 5,071,362 A | 12/1991 | Martens et al. | |
| 5,147,992 A | 9/1992 | Eriksen et al. | |
| 5,158,470 A | 10/1992 | Zarreii | |
| 5,276,443 A * | 1/1994 | Gates et al. | 710/2 |
| 5,315,204 A | 5/1994 | Park | |
| 5,348,491 A | 9/1994 | Louwagie et al. | |
| 5,481,073 A * | 1/1996 | Singer et al. | 200/1 R |
| 5,516,299 A | 5/1996 | Fukuda et al. | |
| 5,592,545 A | 1/1997 | Ho et al. | |
| 5,635,881 A | 6/1997 | Romerein et al. | |
| 5,638,035 A | 6/1997 | Romerein et al. | |
| 5,712,603 A | 1/1998 | Kim et al. | |
| 5,885,096 A | 3/1999 | Ogren | |
| 5,909,063 A | 6/1999 | Silliman et al. | |
| 5,909,155 A | 6/1999 | Anderson et al. | |
| 5,944,546 A | 8/1999 | Miyake et al. | |
| 5,955,930 A | 9/1999 | Anderson et al. | |
| 5,989,046 A | 11/1999 | Togashi | |
| 6,292,371 B1 | 9/2001 | Toner, Jr. | |
| 6,371,780 B1 | 4/2002 | Aponte et al. | |
| 6,520,785 B2 | 2/2003 | Hida | |
| 6,545,562 B2 | 4/2003 | Loeffelholz et al. | |
| 6,635,821 B2 | 10/2003 | Loeffelholz et al. | |
| 6,720,841 B2 | 4/2004 | Loeffelholz et al. | |
| 6,791,041 B1 * | 9/2004 | Chen et al. | 200/51 R |
| 6,888,078 B2 | 5/2005 | Loeffelholz et al. | |
| 6,992,257 B2 * | 1/2006 | Follingstad et al. | 200/51 R |
| 7,025,611 B2 * | 4/2006 | Leighton | 439/188 |
| 7,029,285 B2 | 4/2006 | Abe | |
| 7,135,649 B2 | 11/2006 | Loeffelholz et al. | |
| 7,230,192 B2 | 6/2007 | Loeffelholz et al. | |

* cited by examiner

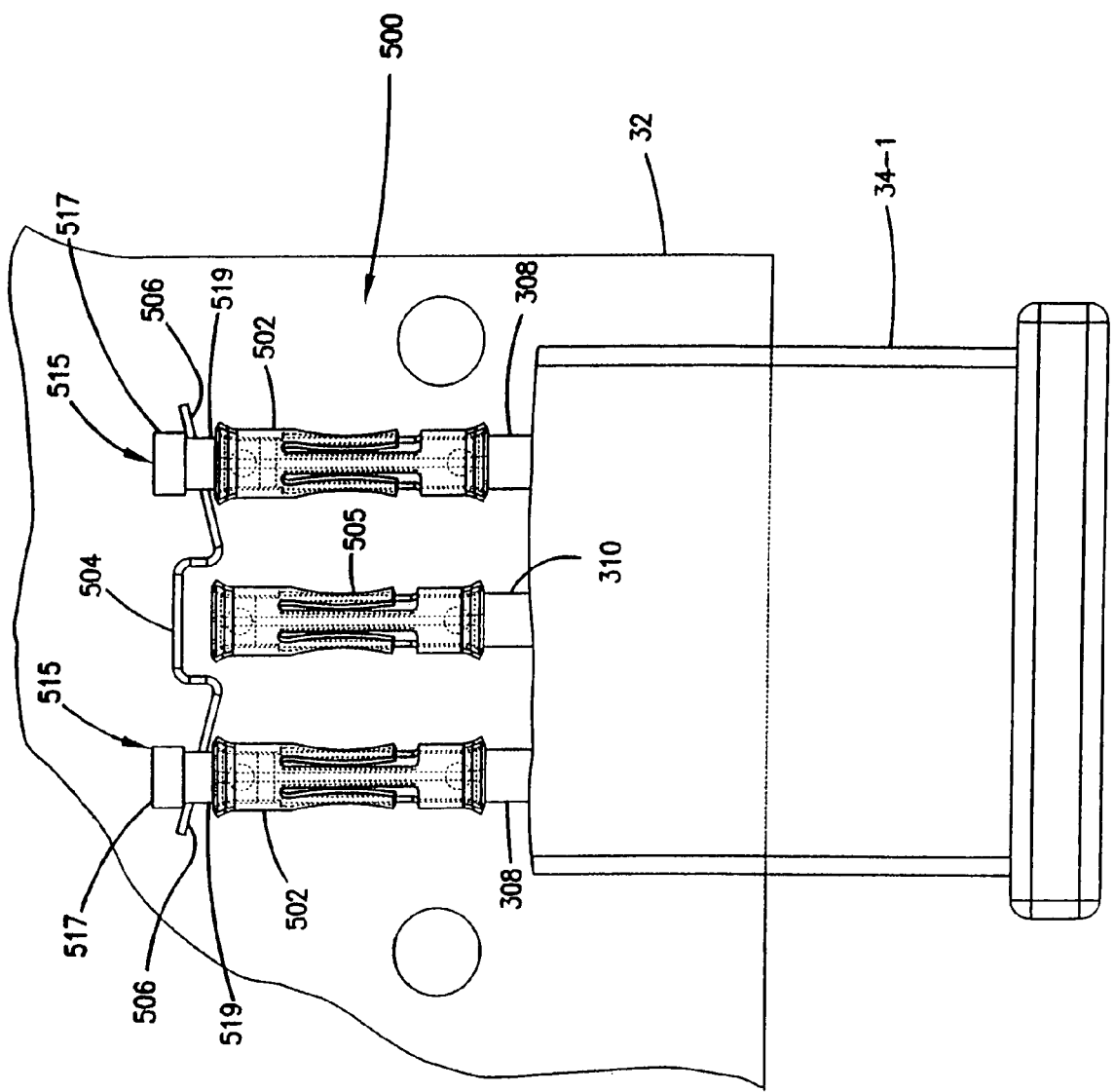

PLUG CONNECTOR FOR CABLE TELEVISION NETWORK AND METHOD OF USE

CROSS REFERENCE TO RELATED APPLICATIONS

This application is a continuation of application Ser. No. 11/343,905, filed Jan. 31, 2006 now U.S. Pat. No. 7,230,192; which is a continuation of application Ser. No. 11/095,132, filed Mar. 30, 2005, now U.S. Pat. No. 7,135,649; which is a continuation of application Ser. No. 10/777,694, filed Feb. 12, 2004, now U.S. Pat. No. 6,888,078; which is a continuation of application Ser. No. 10/330,450, filed Dec. 27, 2002, now U.S. Pat. No. 6,720,841; which is a divisional application Ser. No. 09/780,585, filed Feb. 9, 2001, now U.S. Pat. No. 6,545,562; which applications are incorporated herein by reference.

BACKGROUND OF THE INVENTION

1. Field of the Invention

This invention pertains to telecommunications components for use in telecommunications systems such as cable television networks.

2. Description of the Prior Art

In the telecommunications industry and more particularly in the video transmission industry (e.g., the cable television environment), broad-band radio frequency (RF) signals (i.e., 5 MHz to 1 GHz) are carried over coax conductors from a headend to consumers. At the headend of the system, numerous signals are manipulated to achieve a wide variety of functions and objectives. For example, signals carried on numerous coax cables may be combined onto a single coax conductor. Similarly, a signal on a main coax conductor may be divided into a plurality of signals carried on branch coax conductors. Additionally, signals may be added or removed from a main conductor through directional couplers or the like.

In addition to combining, splitting, diverting or adding signals, the headend will also include apparatus for modifying signals. For example, in order to adequately tune the system, it may be desirable to provide attenuators or the like to attenuate a signal to a desired level. Further, as a broadband RF signal is carried over a length of cable, the high frequency range of the signal may be attenuated more than a low frequency range of the signal. As a result, equalizers are utilized to modify the signal to have a level intensity throughout its frequency range.

Frequently, tuning is accomplished through the use of plug-in devices (e.g., attenuators or equalizers). Exemplary systems including plug-in devices are disclosed in U.S. Pat. No. 5,955,930, which is hereby incorporated by reference.

Currently the cable television environment uses plug-in devices that break the signal paths while changing out the plug-in devices. However, with the new opportunities that are present in the cable television environment (e.g., telephony, data and 911 service), it is important to prevent signal paths from being broken. Thus, what are needed are plug-in devices for the cable television industry that prevent signal paths from being broken when plug-in devices are changed out.

SUMMARY OF THE INVENTION

One aspect of the present invention relates to a telecommunications apparatus for use with a plug having at least first, second and third pins. The telecommunications apparatus includes a plug connector for receiving the plug. The plug connector includes at least first, second and third electrical contacts for electrically contacting the first, second and third pins, respectively, when the plug is inserted in the plug connector. The plug connector also includes an electrical by-pass pathway that: i) electrically connects the first and second electrical contacts when the plug is fully removed from the plug connector such that a signal can enter the plug connector through the first contact, pass through the by-pass pathway to the second contact, and exit the plug connector through the second contact; and ii) does not electrically connect the first and second electrical contacts when the plug is fully inserted within the plug connector such that a signal can enter the plug connector through the first contact, pass through the plug to the second contact, and exit the plug connector through the second contact.

BRIEF DESCRIPTION OF THE DRAWINGS

FIG. 9A shows a third plug connector constructed in accordance with the principles of the present invention, the plug connector is shown with a plug fully inserted therein;

DETAILED DESCRIPTION

Referring now to the several drawing figures in which identical elements are numbered identically throughout, a description of the preferred embodiment of the present invention will now be provided.

An important aspect of the present invention relates to plug connectors configured for preventing signal paths from being broken during plug changes. The phrase "plug connector" will be understood to include devices or arrangements adapted for receiving or otherwise providing electrical connections with plugs. In preferred embodiments, the plug connectors are adapted for providing electrical connections with multi-pin (e.g., three or four pin) RF circuitry plugs such as equalizer plugs or attenuator plugs.

The various aspects of the present invention assist in reducing downtime experienced by network headends (e.g., cable television headends) during network reconfigurations. This reduction in downtime is particularly important in cable television systems because of the increased prevalence of services such as telephony services, 911 services and data services. Further, in certain embodiments, the inventive plug connectors can be configured to allow signals to pass therethrough even in the absence of plugs. This allows plugs to be eliminated with respect to certain lines thereby reducing cost.

FIGS. 1-6 show exemplary RF equipment for which plug connectors in accordance with the present invention could be used. It will be appreciated that the disclosed RF components are merely examples of the type of equipment to which the various aspects of the present invention are applicable. Thus, it will also be appreciated that the various aspects of the present invention are applicable to types of RF components other than those specifically shown. Further, the present invention has general applicability in the telecommunications field, and is not limited to RF applications.

Figure 1:
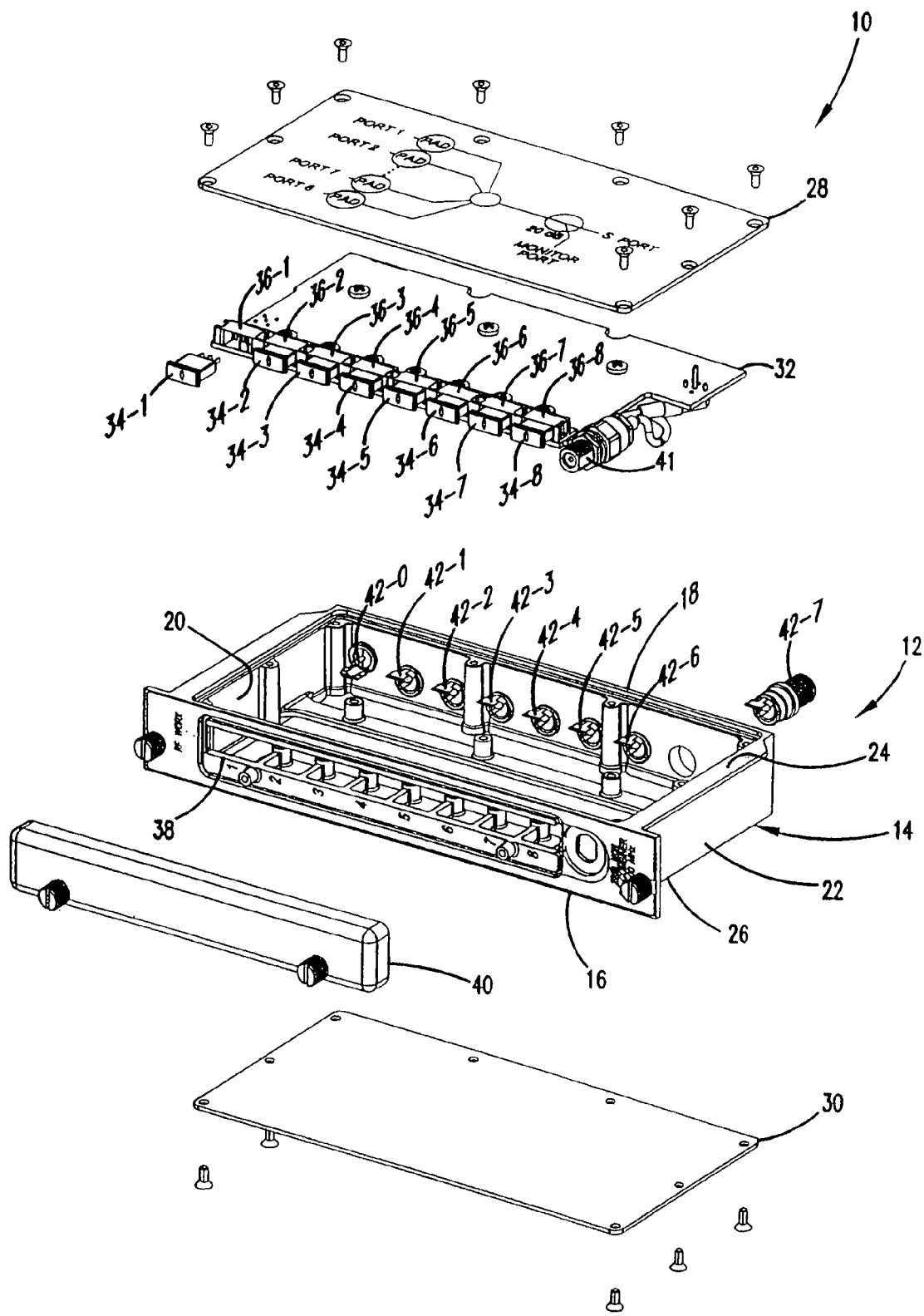
FIG. 1 is an exploded, perspective view of an RF combiner module suitable for practicing the principles of the present invention.

FIG. 1 shows an eight port RF combiner module 10 suitable for use in practicing various aspects of the present invention. The module 10 includes a housing 12 having a generally rectangular frame 14. The frame 14 defines a front 16 positioned opposite from a back 18. Oppositely positioned end walls 20 and 22 extend between the front 16 and the back 18 and define minor sides of the frame 14. Major sides 24 and 26 of the frame 14 are open. The major sides 24 and 26 of the frame 14 are respectively enclosed by removable plates 28 and 30 secured to the frame 14 by fasteners (e.g., bolts or screws).

The housing 12 is adapted for at least partially enclosing radio frequency circuitry (e.g., splitter circuitry, combiner circuitry, etc.). While the circuitry could have any number known configurations, preferably the circuitry is provided on a circuit board 32 sized to be mounted within the housing 12. In the embodiment of FIG. 1, the circuitry includes eight attenuator plugs 34-1 to 34-8 positioned adjacent to a front edge of the circuit board 32. The attenuator plugs 34-1 to 34-8 are received within corresponding plug connectors 36-1 to 36-8 mounted on the board 32 adjacent the front edge of the board 32. When the circuit board 32 is mounted within the housing 12, the attenuator plugs 34-1 to 34-8 can be accessed through an elongated plug access opening 38 defined by the front 16 of the frame 14. The housing 12 preferably also includes a removable front cover 40 that is secured to the front 16 of the frame 14 so as to cover the plug access opening 38. By removing the front cover 40 from the frame 14, the attenuator plugs 34-1 to 34-8 can be accessed through the plug access opening 38.

The module 10 further includes a plurality of connectors 42-0 to 42-8 (only 8 are visible in FIG. 1) mounted at the back 18 of the frame 14. While the connectors 42-0 to 42-8 can have any number of configurations, the connectors are preferably 75 ohm coaxial connectors such as BNC type connectors or F type connectors. The connectors 42-0 to 42-8 are preferably connected to a rear edge of the circuit board 32 by conventional techniques such as card edge connectors. Additionally, grounded shields of the connectors 42-0 to 42-8 are preferably in electrical contact with the frame 14 of the housing 12. A monitor port 41 is electrically connected to the circuit board 32, and is adapted to be mounted at the front side 16 of the housing 12.

Figure 2:
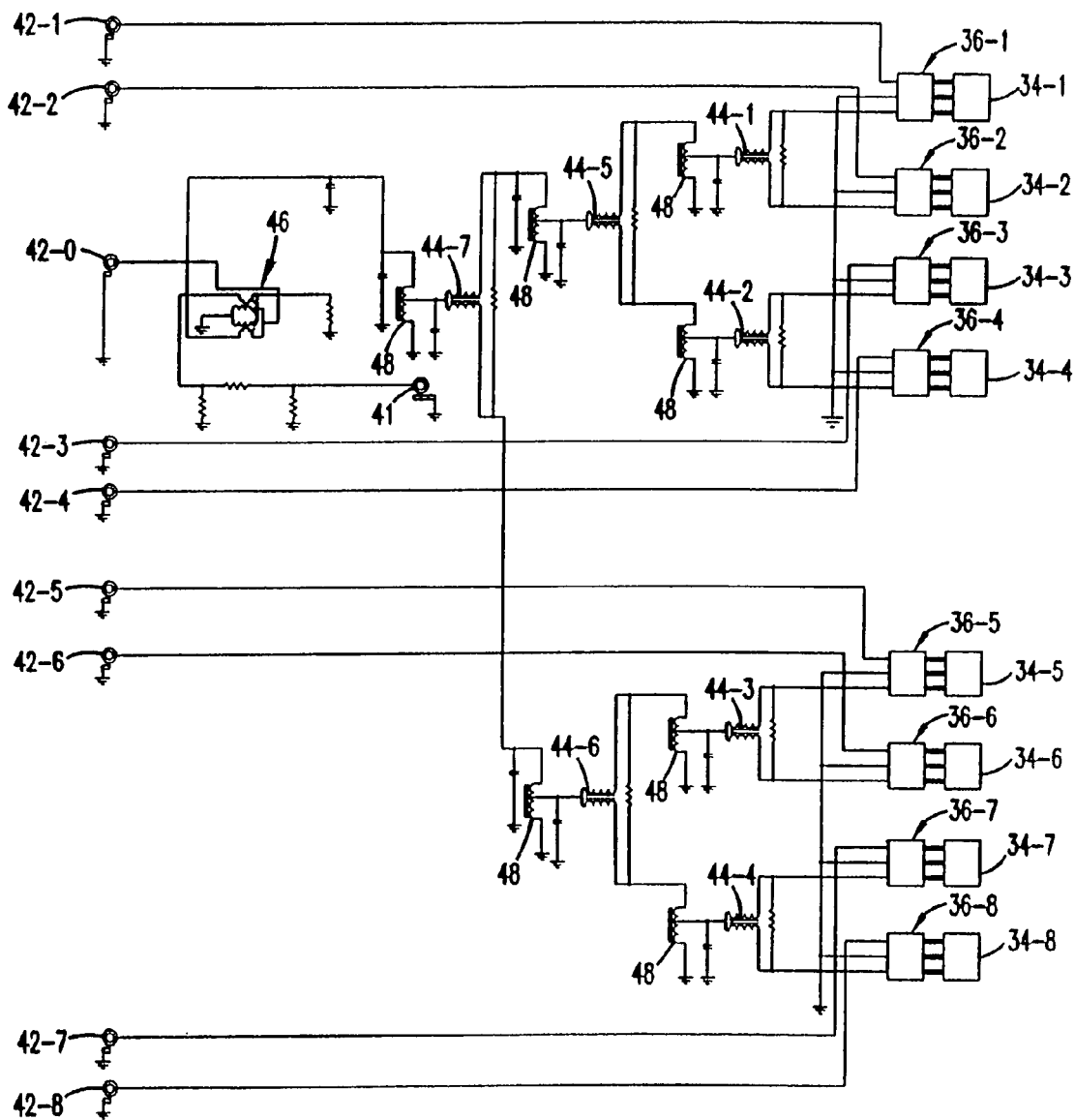
FIG. 2 schematically depicts radio frequency circuitry suitable for use with the combiner of FIG. 1.

FIG. 2 schematically depicts an exemplary circuit diagram for the combiner of FIG. 1. As shown in FIG. 2, the combiner includes a first two-to-one combiner 44-1 electrically connected to plug connectors 36-1 and 36-2, a second two-to-one combiner 44-2 electrically connected to plug connectors 36-3 and 36-4, a third two-to-one combiner 44-3 electrically connected to plug connectors 36-5 and 36-6, and a fourth two-to-one combiner 44-4 electrically connected to plug connectors 36-7 and 36-8. The first and second combiners 44-1 and 44-2 are electrically connected to a fifth two-to-one combiner 44-5, and the third and fourth two-to-one combiners 44-3 and 44-4 are electrically connected to a sixth two-to-one combiner 44-6. The fifth and sixth two-to-one combiners 44-5 and 44-6 are electrically connected to a seventh two-to-one combiner 44-7. The seventh two-to-one combiner 44-7 is electrically connected to a directional coupler 46. The directional coupler 46 is electrically connected to coaxial connector 42-0 as well as monitor port 41.

Those of skill in the art will appreciate that the combiners 44-1 to 44-7 are depicted as transformers. Additionally, the system includes transformers 48 for converting signals combined by the combiners 44-1 to 44-7 from 37.5 ohms back to 75 ohms.

In use of the system of FIG. 2, signals input at connectors 42-1 and 42-2 pass respectively through attenuator plugs 34-1 and 34-2 and are combined by combiner 44-1, and signals input through connectors 42-3 and 42-4 are passed respectively through attenuator plugs 34-3 and 34-4 and combined by combiner 44-2. In the same manner, signals input at connectors 42-5 and 42-6 are passed respectively through attenuator plugs 34-5 and 34-6 and combined at combiner 44-3, and signals input through connectors 42-7 and 42-8 are respectively passed through attenuator plugs 34-7 and 34-8 and combined at combiner 44-4. At combiner 44-5, the combined signal from combiner 44-1 is combined with the combined signal from combiner 44-2. At the combiner 44-6, the combined signal from combiner 44-3 is combined with the combined signal from combiner 44-4. At combiner 44-7, the combined signals from combiners 44-5 and 44-6 are combined to provide a single, main signal. The main signal is passed through the directional coupler 46 and output from the module through connector 42-0. At the directional coupler 46, a small portion of the main signal is split off to the monitor port 41.

While the configuration of FIG. 2 has been described as an eight to one coupler, it will be appreciated that the same configuration could also be used as an eight-to-one splitter with monitor capabilities by slightly modifying the configuration of the directional coupler 46. In other words, it will be understood by those of skill in the art that the transformers 44-1 to 44-7 can be used as splitters as well as combiners.

Figure 3:
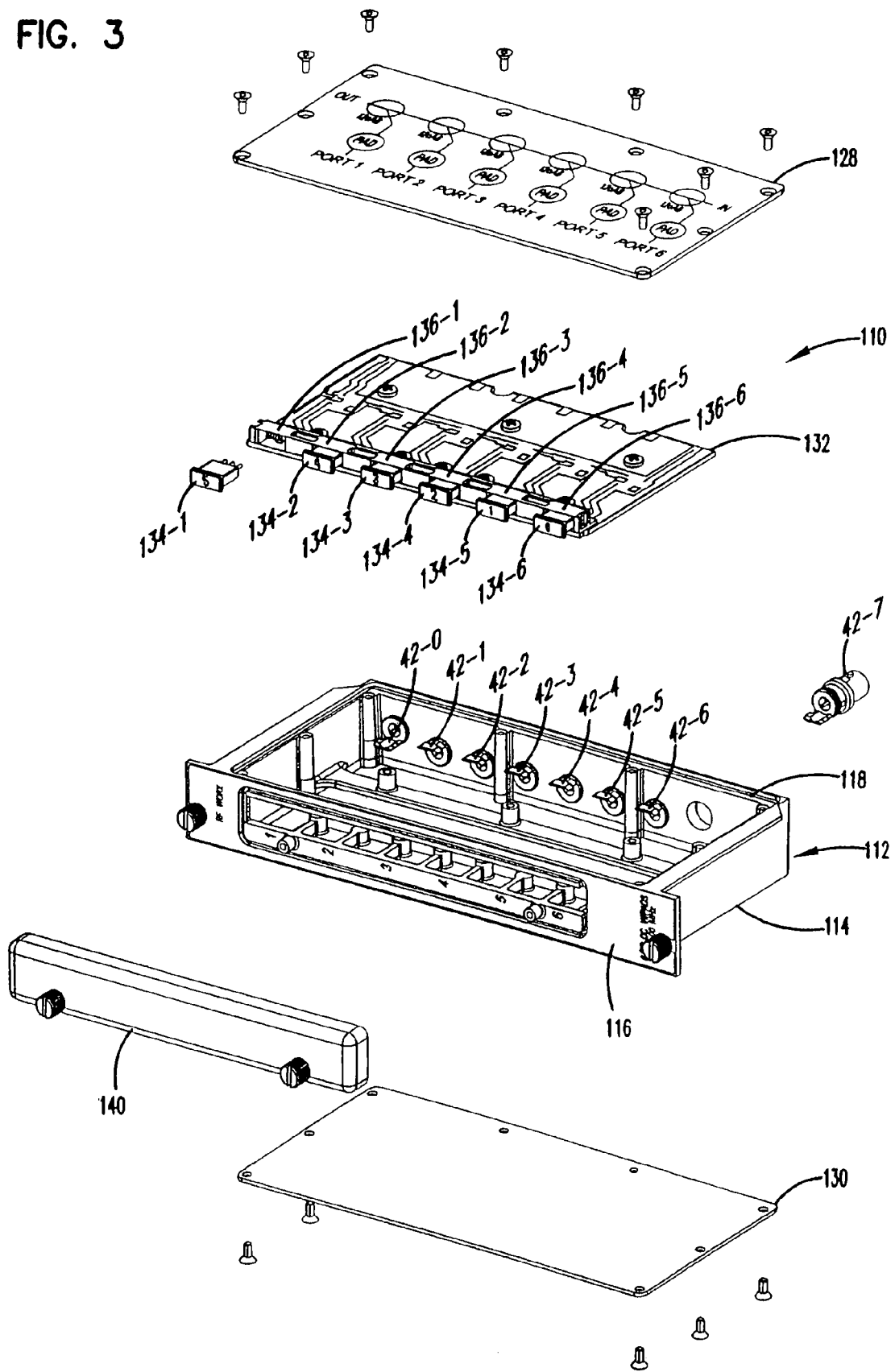
FIG. 3 is an exploded, perspective view of another RF combiner module suitable for practicing the principles of the present invention.

FIG. 3 illustrates a six port combiner module 110 suitable for practicing various aspects of the present invention. The module 110 includes a housing 112 having a frame 114 defining a front 116 and a back 118. The housing 112 is adapted for at least partially enclosing radio frequency circuitry such as circuit board 132. Plug connectors 136-1 to 136-6 are mounted at a front edge of the circuit board 132. Attenuator plugs 134-1 to 134-6 are shown inserted within the plug connectors 136-1 to 136-6. The attenuator plugs 134-1 to 134-6 can be accessed at the front 116 of the housing 112 by removing a front cover 140 from the frame 114. A plurality of coaxial connectors 42-0 to 42-7 are mounted at the back 118 of the housing 112 and are electrically connected to a rear edge of the circuit board 132. Removable plates 128 and 130 are provided for enclosing open sides of the frame 114.

Figure 4:
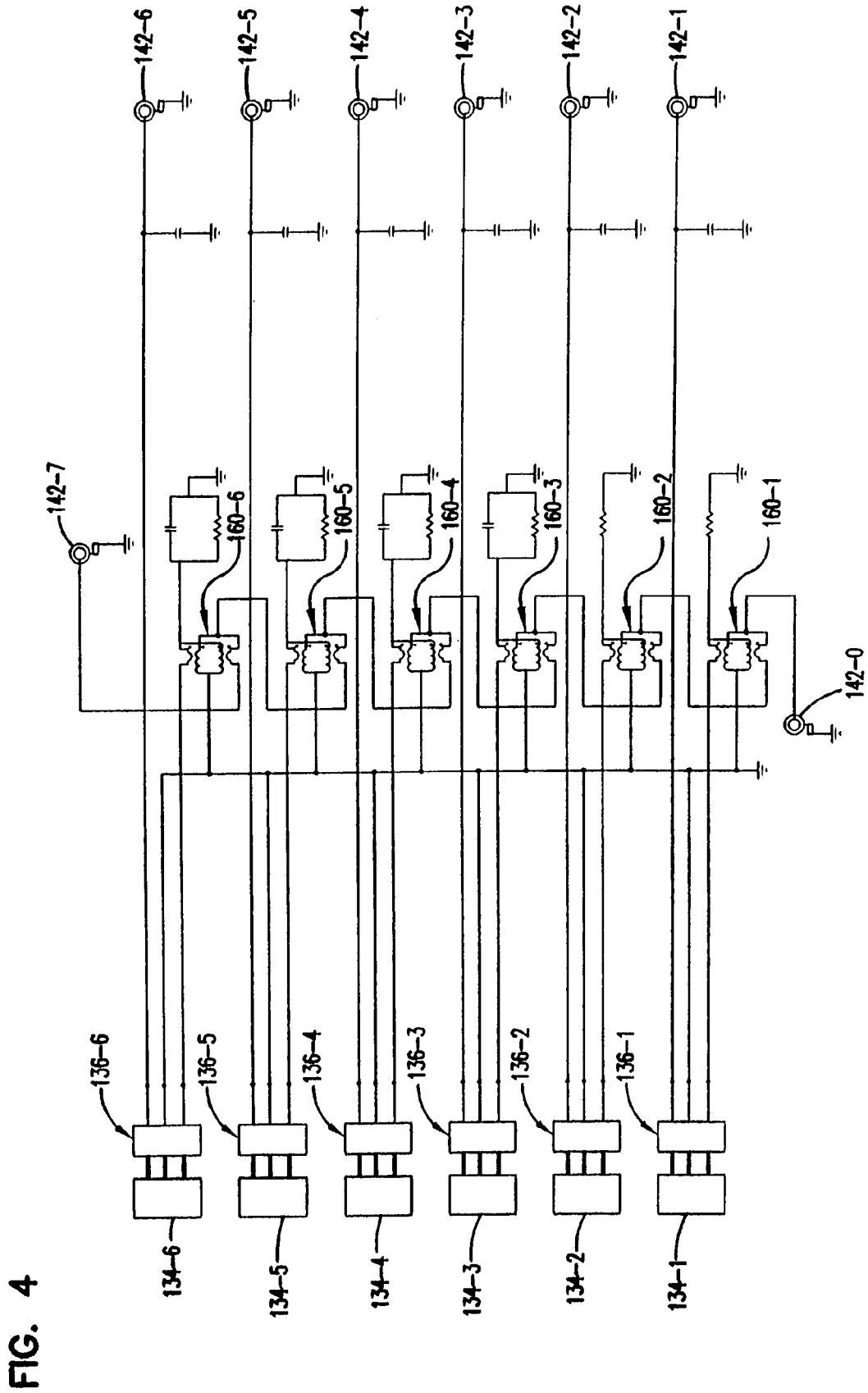
FIG. 4 is a schematic view of radio frequency circuitry suitable for use with the combiner of FIG. 3.

FIG. 4 shows an exemplary circuit layout for the circuit board 132 of FIG. 3. The schematic includes six directional couplers 160-1 to 160-6 connected in series. Coupler 160-1 is electrically connected to plug connector 136-1 and coaxial connector 142-0. Directional coupler 160-2 is electrically connected to plug connector 136-2 and directional coupler 160-1. Directional coupler 160-3 is electrically connected to plug connector 136-3 and directional coupler 160-2. Directional coupler 160-4 is electrically connected to plug connector 136-4 and directional coupler 160-3. Directional coupler 160-5 is electrically connected to plug connector 136-5 and directional coupler 160-4. Directional coupler 160-6 is electrically connected to plug connector 136-6, directional coupler 160-5 and coaxial connector 142-7. Coaxial connectors 142-1 to 142-6 are respectively connected to plug connectors 136-1 to 136-6 such that signals input through the connectors 142-1 to 142-6 are respectively passed through attenuator plugs 134-1 to 134-6. After passing through the attenuator plugs 134-1 to 134-6, the signals are directed to their respective directional coupler 160-1 to 160-6.

In use, a signal input at coaxial connector 142-0 is combined with a signal input at coaxial 142-1 at coupler 160-1. The combined signal from coupler 160-1 is combined with a signal input through coaxial connector 142-2 at coupler 160-2. The combined output from coupler 160-2 is combined with a signal input through connector 142-3 at coupler 160-3. The combined signal from directional coupler 160-3 is combined with a signal input through connector 142-4 at directional coupler 160-4. The combined signal output from directional coupler 160-4 is combined with a signal input through connector 142-5 at directional coupler 160-5. The combined signal output from directional coupler 160-5 is combined with a signal input through connector 142-6 at directional coupler 160-6. Directional coupler 160-6 outputs a single main signal from the module at connector 142-0.

Figure 5:
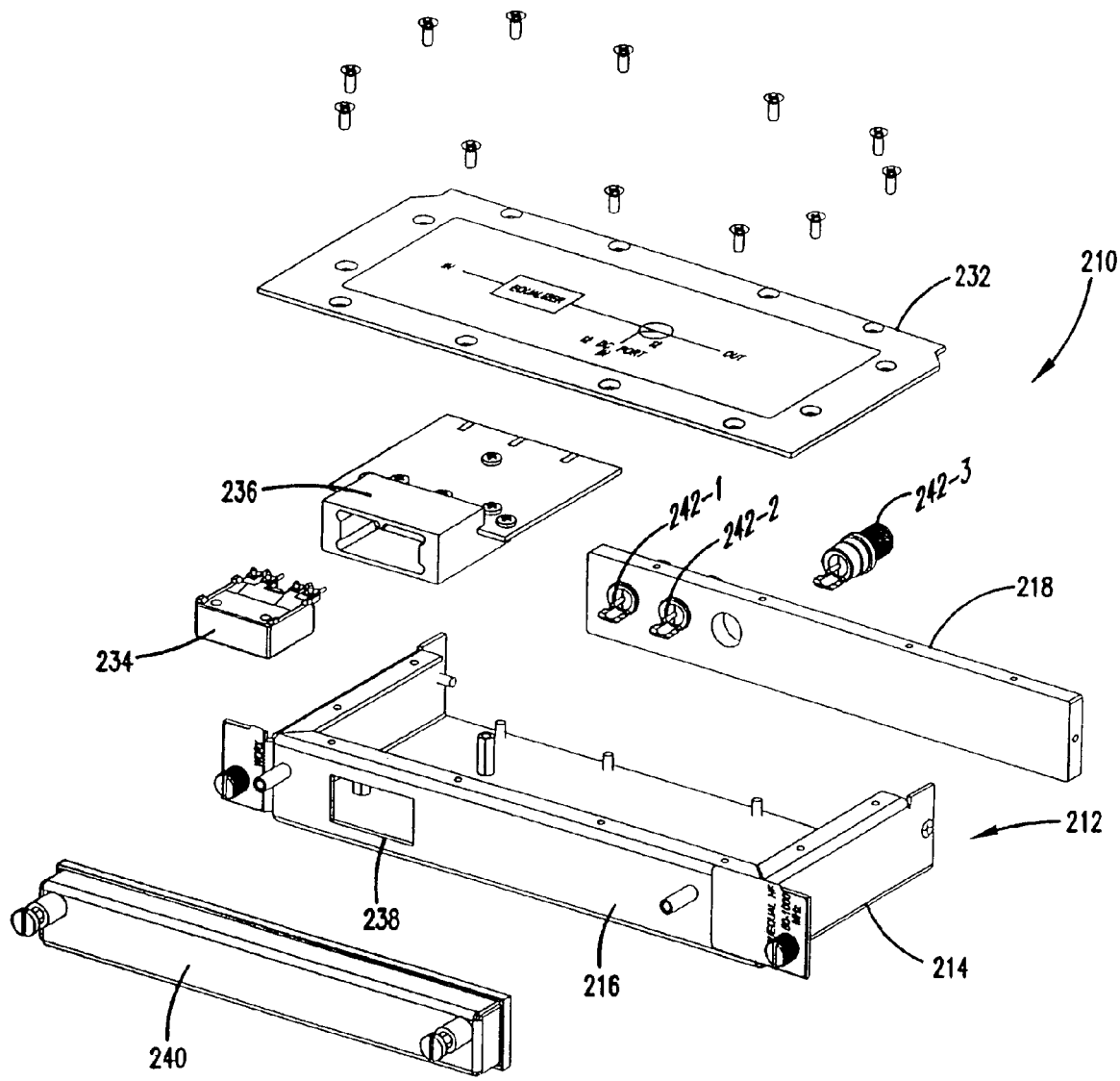
FIG. 5 is an exploded, perspective view of an RF equalizer module suitable for practicing the principles of the present invention.

FIG. 5 illustrates an equalizer module 210 suitable for use in practicing the present invention. The module 210 includes a housing 212 having a frame 214 defining a front 216 and a back 218. Three coaxial connectors 242-1 to 242-3 are mounted at the back 218 of the frame 214. A circuit board 232 is mounted within the housing 212. The coaxial connectors 242-1 to 242-3 are preferably electrically connected to a back edge of the circuit board 232. A plug connector 236 is mounted at a front edge of the circuit board 232. The plug connector 236 defines a port sized for receiving an equalizer plug 234. When the circuit board 232 is mounted within the housing 212, the equalizer 234 can be accessed from the front of the housing 212 through an access opening 238 defined by the front 216 of the frame 214. The access opening 238 can be covered by a removable front cover 240.

Figure 6:
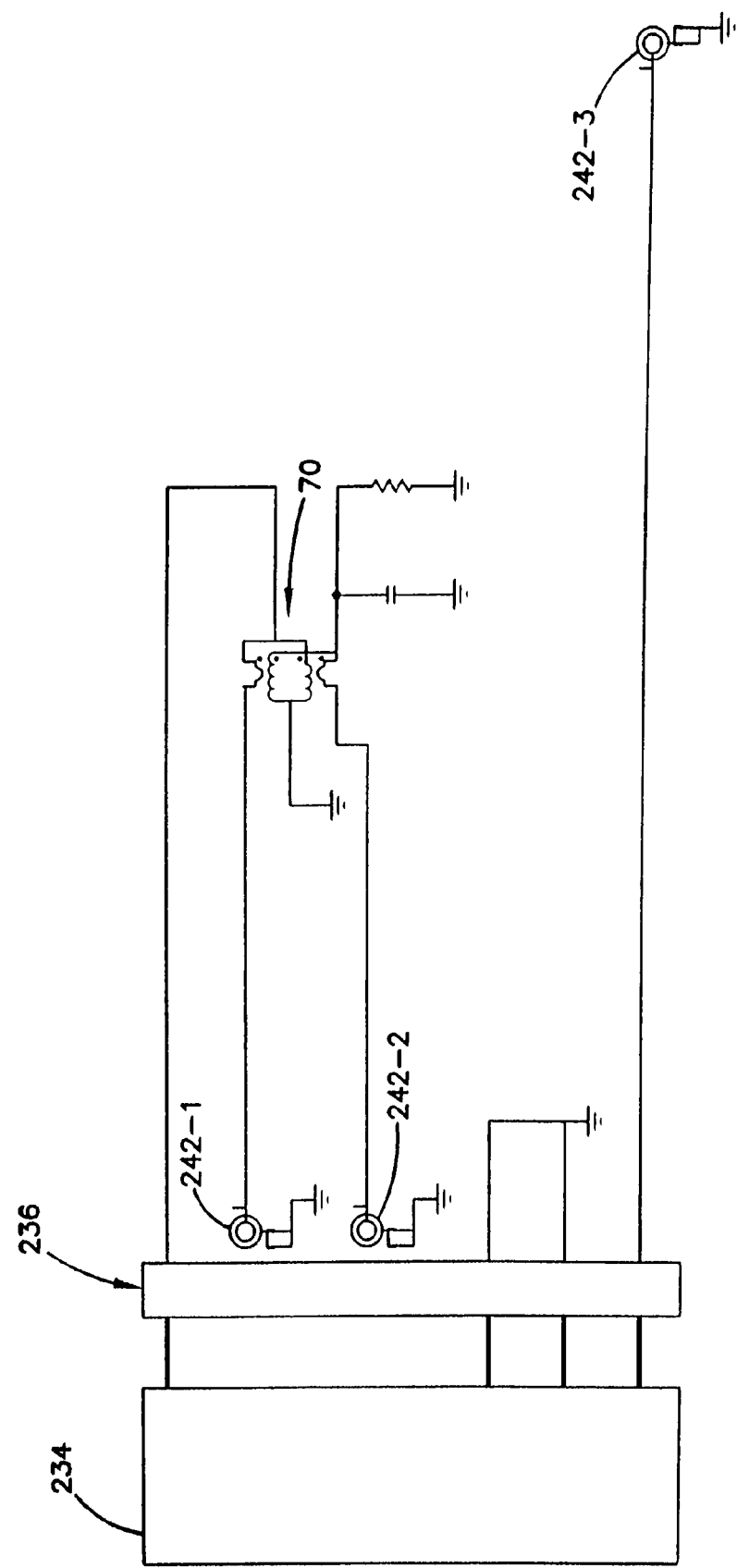
FIG. 6 is a schematic view of radio frequency circuitry suitable for use with the equalizer of FIG. 5.

FIG. 6 illustrates an exemplary circuit layout for the circuit board 232 of the equalizer module of FIG. 5. Referring to FIG. 6, the circuit layout includes a directional coupler 70 electrically connected to plug connector 236, coaxial connector 242-1, and coaxial connector 242-2. The plug connector 236 is also connected to coaxial connector 242-3. The equalizer plug 234 is shown inserted within the plug connector 236.

In use of the equalizer, a signal is input through coaxial connector 242-1 and is passed to directional coupler 70. At the directional coupler 70, a small portion of the signal is split and directed to monitor port 242-2. The majority of the signal is passed from the directional coupler 70 to the equalizer 234. The signal then passes through the equalizer 234 and is output from the module 210 at coaxial connector 242-3.

Attenuator plugs are commercially available items such as those sold as Product No. F-7520-A (for a 20 dB attenuator) through Communication Associates 1750 T-'Coleman Road, Anniston, Ala. 36207. The plugs 34-1 to 34-8 can be individually selected to provide a discrete amount of attenuation to a signal. For example, a "zero" plug can be inserted into a plug connector to provide 0 dB attenuation. Alternatively, at an option of a technician, the 0 dB plug may be replaced with a plug capable of providing signal attenuation. For example, a 15 dB plug can be used to provide 15 dB attenuation to a signal. As a result, each of the branch circuits can be individually provided with a unique attenuation selected at an option of a technician.

In FIGS. 1-6, the plug connectors (e.g., plug connectors 36-1 to 36-8 of the embodiment of FIGS. 1-2; the plug connectors 136-1 to 136-6 of the embodiment FIGS. 2-4; and the plug connector 236 of the embodiment of FIGS. 5-6) are generically depicted. As indicated above, an important aspect of the present invention is to provide plug connectors configured to prevent the signal paths passing therethrough from being broken during plug changes. Thus, in accordance with the principles of the present invention, the plug connectors 36-1 to 36-8, 136-1 to 136-6 and 236 preferably include internal components adapted for preventing signals passing through the plug connectors from being broken during plug changes.

Figure 7A:
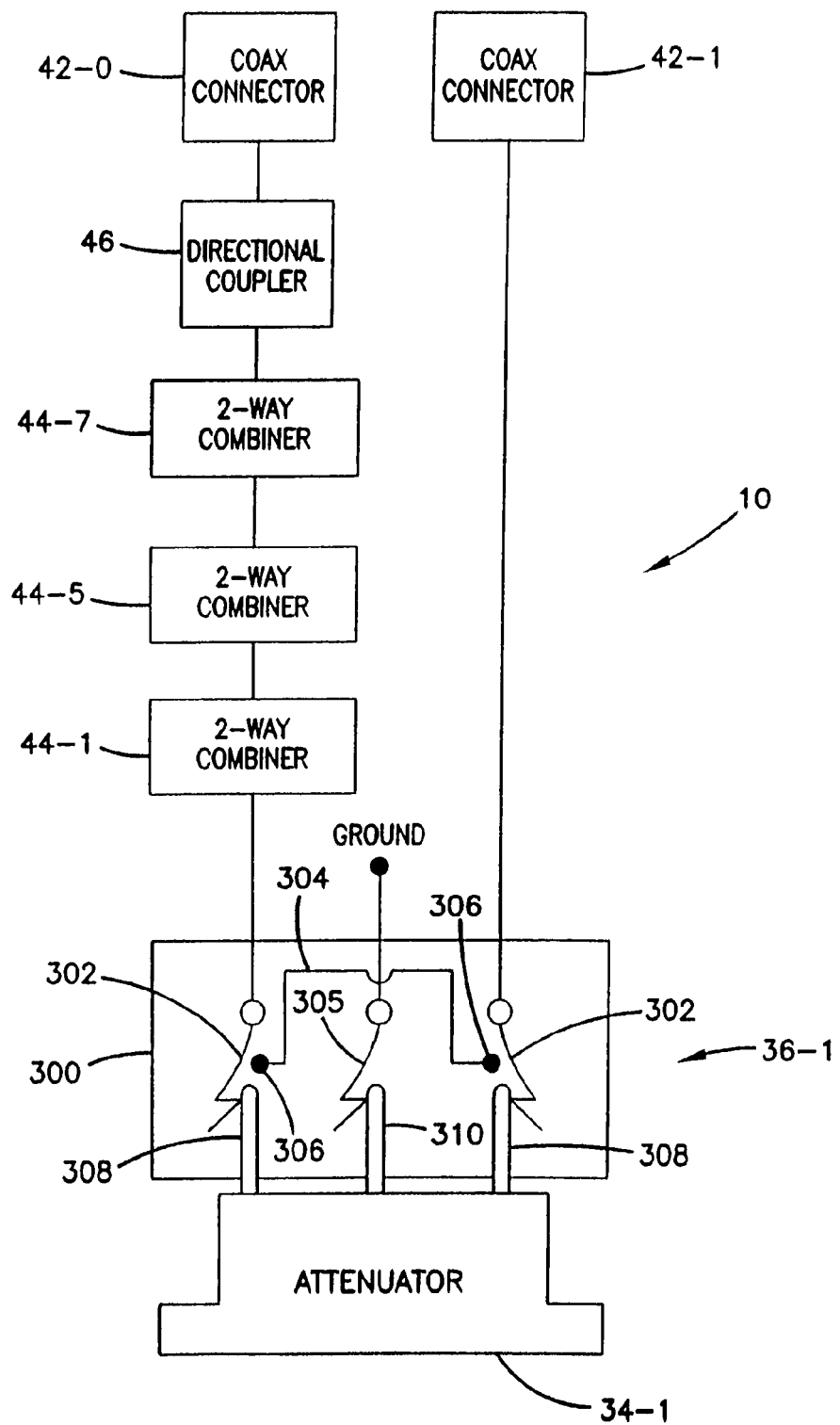
FIG. 7A schematically shows a portion of a combiner having a plug connector in accordance with the principles of the present invention, an attenuator plug is shown fully inserted within the plug connector.
Figure 7B:
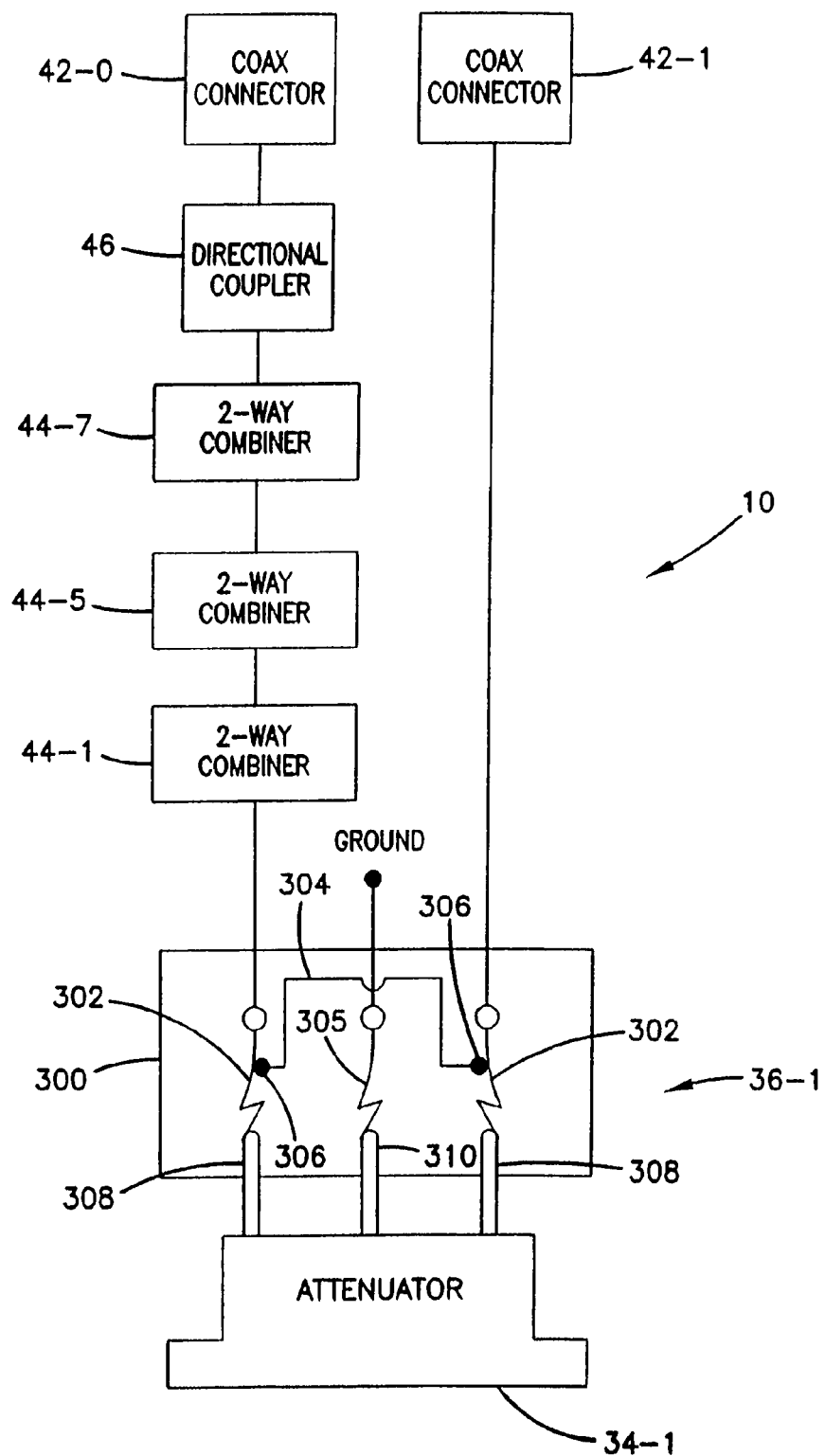
FIG. 7B schematically shows the combiner of FIG. 7A with the plug partially removed from the plug connector.

FIGS. 7A and 7B schematically illustrate one of the input lines of the combiner module 10 of FIGS. 1 and 2. The portions of the module 10 that are schematically depicted include the coaxial connector 42-1, plug connector 36-1, attenuator 34-1, combiner 44-1, combiner 44-5, combiner 44-7, directional coupler 46 and coaxial connector 42-0. FIG. 7A shows the attenuator 34-1 fully inserted within the plug connector 36-1, while FIG. 7B shows the attenuator 34-1 in the process of being removed from the plug connector 36-1.

Referring still to FIGS. 7A and 7B, the plug connector 36-1 includes a dielectric housing 300 that can be mounted at the edge of a circuit board (e.g., at the edge of the circuit board 32 shown in FIG. 1). Two through-contacts 302 (i.e., IN and OUT contacts) are mounted within the housing 300. One of the through-contacts 302 is electrically connected to the combiner 44-1, and the other through-contact 302 is electrically connected to the coaxial connector 42-1. A conductive bypass-path 304 is used to provide an electrical connection between the two through-contacts 302. The bypass-path 304 includes contact regions 306 positioned adjacent to each of the through-contacts 302. The plug connector 36-1 also includes a ground contact 305 positioned between the two trough-contacts 302. The ground contact 305 is electrically connected to ground.

While the through-contacts 302 and the ground contact 305 could have a variety of different configurations, the contacts 302 and 304 are depicted in FIGS. 7A and 7B as resilient, conductive springs. The through-contacts 302 are preferably biased toward the contact regions 306 of the bypass-pathway 304 such that when no plug is inserted in the housing 300, the through-contacts 302 engage their respective contact regions 306 (i.e., the through-contacts "normally" engage the contact regions). The engagement between the through-contacts 302 and the contact regions 306 causes the bypass-pathway circuit 304 to be closed such that signals can be routed through the plug connector 36-1 even in the absence of a plug.

Referring again to FIGS. 7A and 7B, the attenuator plug 34-1 includes two through-pins 308 (i.e., IN and OUT pins) and a ground pin 310. When the plug 34-1 is inserted in the plug connector 36-1, the through-pins 308 engage the through-contacts 302 and the ground pin 310 engages the ground contact 305. The through-contacts 302 are preferably configured such that when the attenuator plug 34-1 is fully inserted within the plug connector 36-1 (as shown in FIG. 7A), contact between the through-pins 308 and the through-contacts 302 causes the through-contacts 302 to be disconnected from the contact regions 306 of the bypass-pathway 304. In such a configuration, signals entering the plug connector 36-1 are caused to be routed through the attenuator 34-1.

Additionally, the through-contacts 302 and their respective contact regions 306 of the bypass-pathway 304 are preferably relatively positioned such that when the attenuator 34-1 is in the process of being removed from the plug connector 60-1, the through-contacts 302 engage their respective contact regions 306 before the through-contacts 302 disengage from their respective contact pins 308. Thus, during the plug removal process, there is a point in time where the contacts 302 concurrently engage the contact regions 306 and the pins 308. When the through-contacts 302 engage the contact regions 306 of the bypass-pathway 304, the signal being routed through the attenuator 34-1 is diverted through the path of least resistance (i.e., the bypass-path 304) thereby causing the signal to bypass the attenuator 34-1. The continued removal of the attenuator plug 34-1 causes the through-pins 308 to disengage from the through-contacts 302, and the grounding pin 310 to disengage from the grounding contact 305. However, because the through-contacts 302 close the bypass-pathway 304 before being disconnected from the attenuator 34-1, an uninterrupted signal can be passed through the plug connector 36-1 during the entire plug removal process.

Figure 7C:
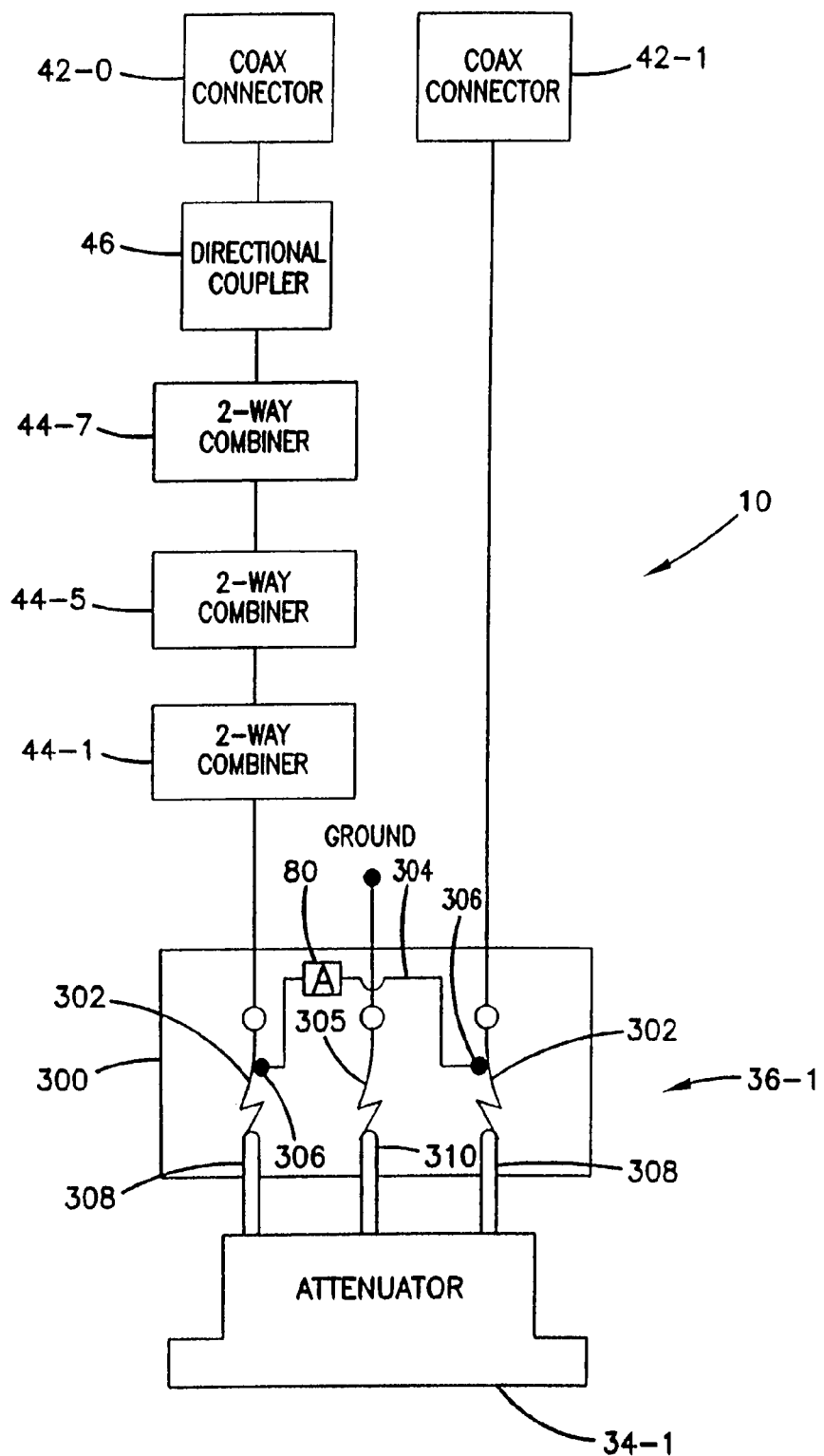
FIG. 7C shows a modified version of the plug connector of FIGS. 7A and 7B.

In the embodiment of FIGS. 7A and 7B, the bypass pathway 304 provides essentially no attenuation of a signal passing therethrough. In alternative embodiments, it may be desirable to place an attenuator (e.g., a 4, 6 or 8 dB attenuator or other alternative) along the bypass pathway 304 such that the plug connector 36-1 provides attenuation even in the absence of an attenuator plug. FIG. 7C shows the plug connector 36-1 of FIGS. 7A and 7B equipped with an attenuator 80 along the bypass pathway 304.

Figure 8:
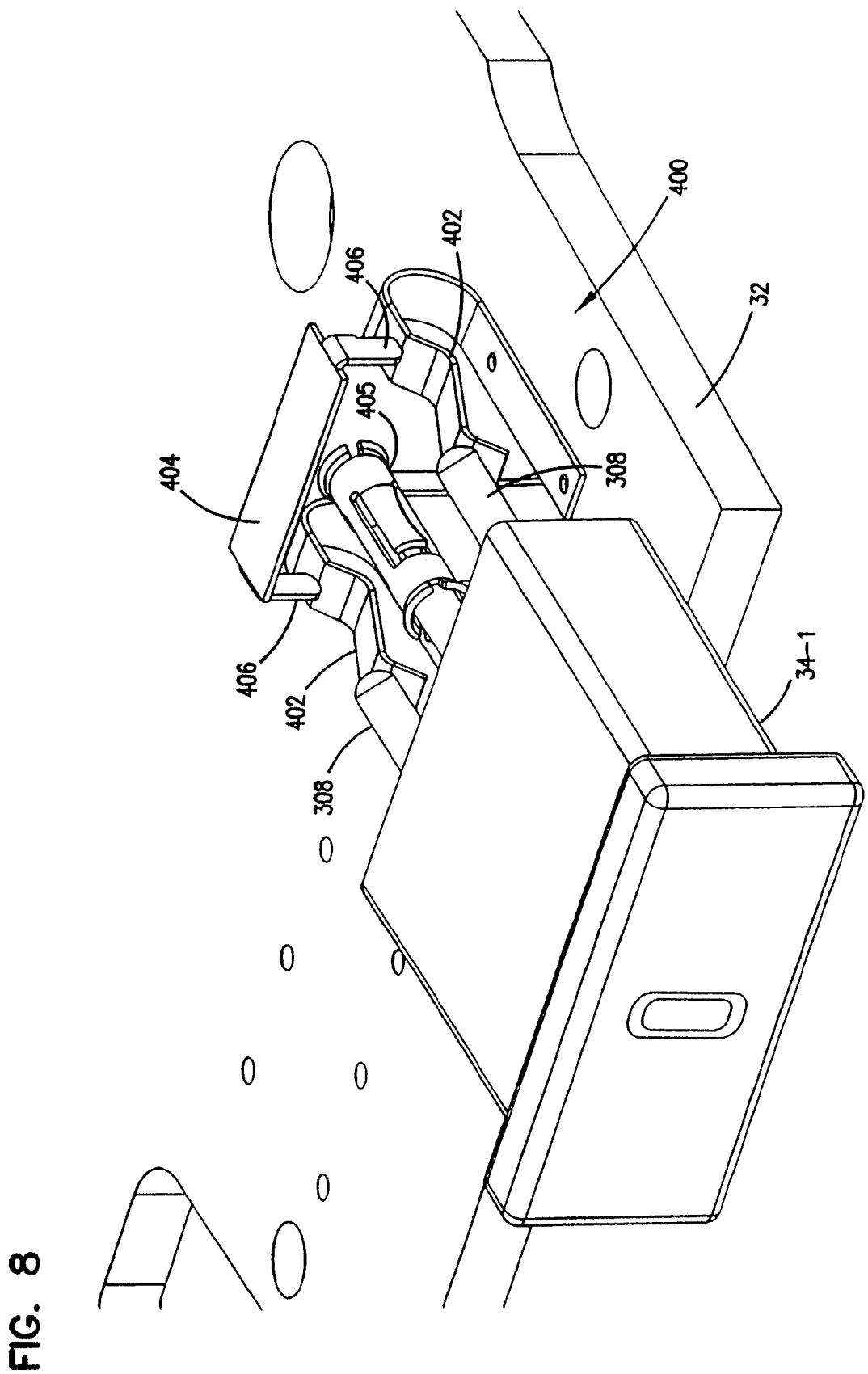
FIG. 8 shows a second plug connector constructed in accordance with the principles of the present invention.

FIG. 8 shows another plug connector 400 constructed in accordance with the principles of the present invention. In FIG. 8, the housing of the plug connector 400 has been removed for clarity. As shown in FIG. 30, the plug connector 400 includes two through-springs 402 that are normally biased into contact with contact regions 406 of a conductive bypass-pathway 404. A grounding sleeve 405 is positioned between the two through-contacts 402. Preferably, the through-contacts 402 are electrically connected to their respective electrical components by tracings provided on circuit board 32. Similarly, grounding sleeve 405 is preferably grounded through circuit board 32.

FIG. 8 shows an attenuator plug 34-1 in an intermediate position in which the plug 34-1 is not fully inserted within the plug connector 400 (i.e., the plug 34-1 is in the process of either being removed from or inserted into the plug connector 400). As shown in FIG. 30, through-pins 308 of the plug 34-1 are in contact with the through-springs 402 of the plug connector 400, and the through-springs 402 are concurrently in contact with the contact regions 406 of the bypass-path 404. Because the bypass-path 404 has a significantly lower resistance than the attenuator 34-1, any signals provided to the plug connector 402 will bypass the plug 34-1 through the by-pass pathway 404.

It will be appreciated that when the plug 34-1 is fully inserted within the plug connector 400, the through springs 402 will be biased downwardly and disengaged from the contact regions 406 of the bypass-pathway 404. Thus, in the fully inserted position, signals routed to the plug connector 400 are forced to be routed through the attenuator 34-1. Also, as previously indicated, when the plug 34-1 is fully withdrawn from the plug connector 400, the springs 402 are normally biased against the contact regions 406 of the bypass-pathway 404. Thus, even when a plug is not inserted within the plug connector 400, signals can still be routed through the plug connector 400 via the bypass-pathway 404.

Figure 9B:
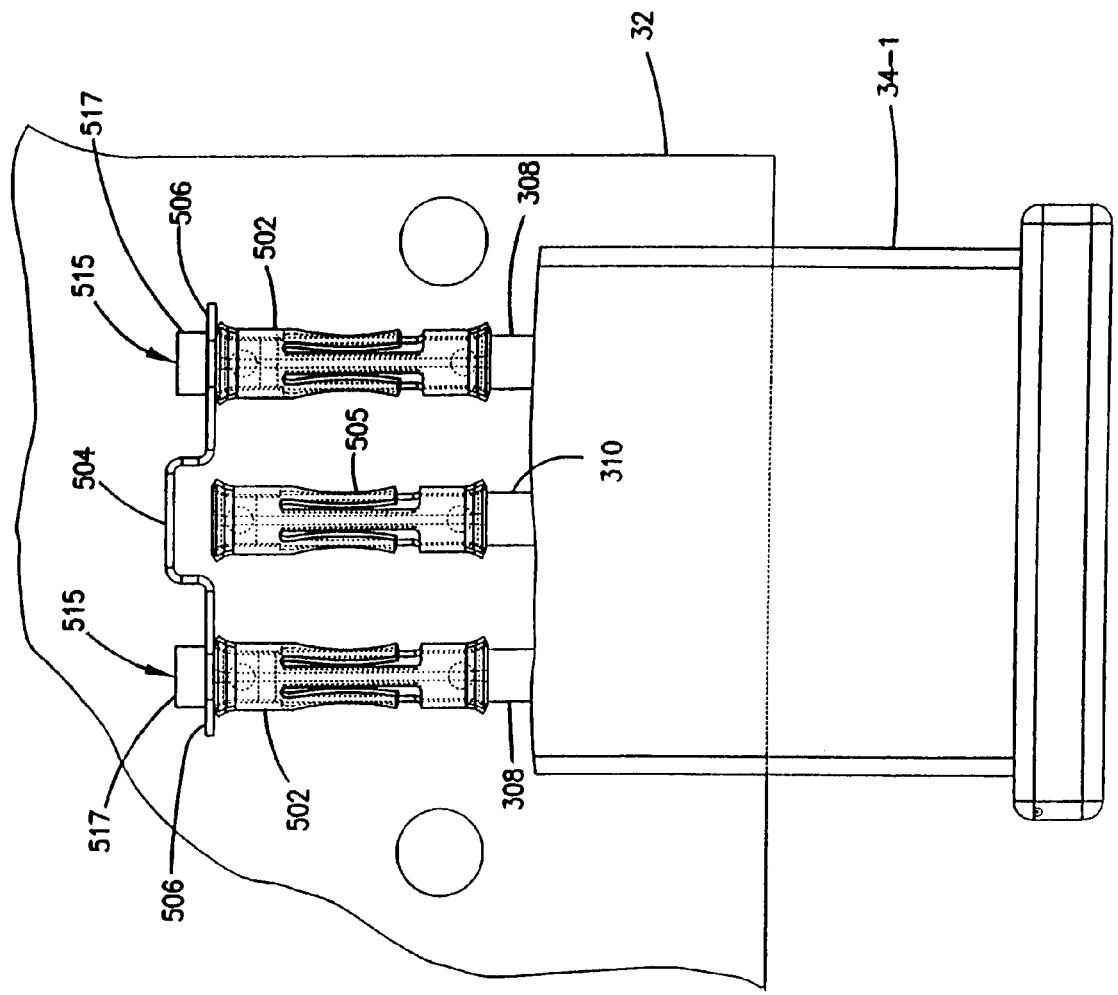
FIG. 9B shows the plug connector of FIG. 9A with the plug partially removed from the plug connector.

FIGS. 9A and 9B illustrate another plug connector 500 constructed in accordance with the principles of the present invention. The plug connector 500 includes two through-sockets 502 adapted to receive through-pins 308 of an attenuator plug 34-1. The plug connector 500 also includes a grounding socket 505 positioned between the through sockets 502. The grounding socket 505 is adapted to receive grounding pin 310 of the attenuator 34-1. Similar to the previous embodiment, the through-sockets 502 are preferably connected to their respective electrical components by tracings provided on circuit board 32. Similarly, grounding socket 505 is preferably grounded through circuit board 32. Once again, for clarity, the housing of the plug connector 500 has not been shown in either of FIG. 9A or 9B.

Referring still to FIGS. 9A and 9B, the plug connector 500 includes a bypass spring 504 having contact regions 506 positioned adjacent the back ends of the through-sockets 502. Dielectric pins 515 are mounted through openings defined through the contact regions 506 (i.e., the contact regions can snap within circumferential grooves formed in the pins 515 directly adjacent the heads 517). For example, the pins 515 can be snap fit through the openings in the contact regions 506. Heads 517 of the pins 515 engage backsides of the contact regions 506, while forward projections 519 of the pins 513 extend through the contact regions 506 and into the through-sockets 502. The forward projections 519 are preferably substantially shorter than a total length of each through-socket 502.

The bypass spring 504 is preferably configured such that the contact regions 506 are normally biased against the back ends of the through socket 502. Thus, when the attenuator 34-1 is not inserted within the plug connector 500, the bypass spring 504 forms a bypass-pathway that extends between the two through sockets 502. When the attenuator plug 34-1 is fully inserted within the plug connector 500 (as shown in FIG. 9A), the through-pins 308 push the dielectric pins 515 rearwardly thereby causing the contact regions 506 of the bypass spring 504 to disengage from the backsides of the through-sockets 502 such that the bypass circuit is opened. With the bypass spring 504 open as shown in FIG. 9A, signals routed to the plug connector 500 are forced to pass through the attenuator 34-1.

FIG. 9B shows the plug 34-1 in the process of being removed from or inserted into the plug connector 500. In the position of FIG. 9A, the through-pins 308 electrically contact the through-sockets 502, and the grounding pin 310 electrically contacts the grounding socket 505. Concurrently, the contact regions 506 of the bypass spring 504 are biased into contact with the backsides of the through sockets 502. In this position, any signal routed to the plug connector 500 will be bypassed through the bypass spring 500 rather than being transferred through the attenuator 34-1.

Figure 10:
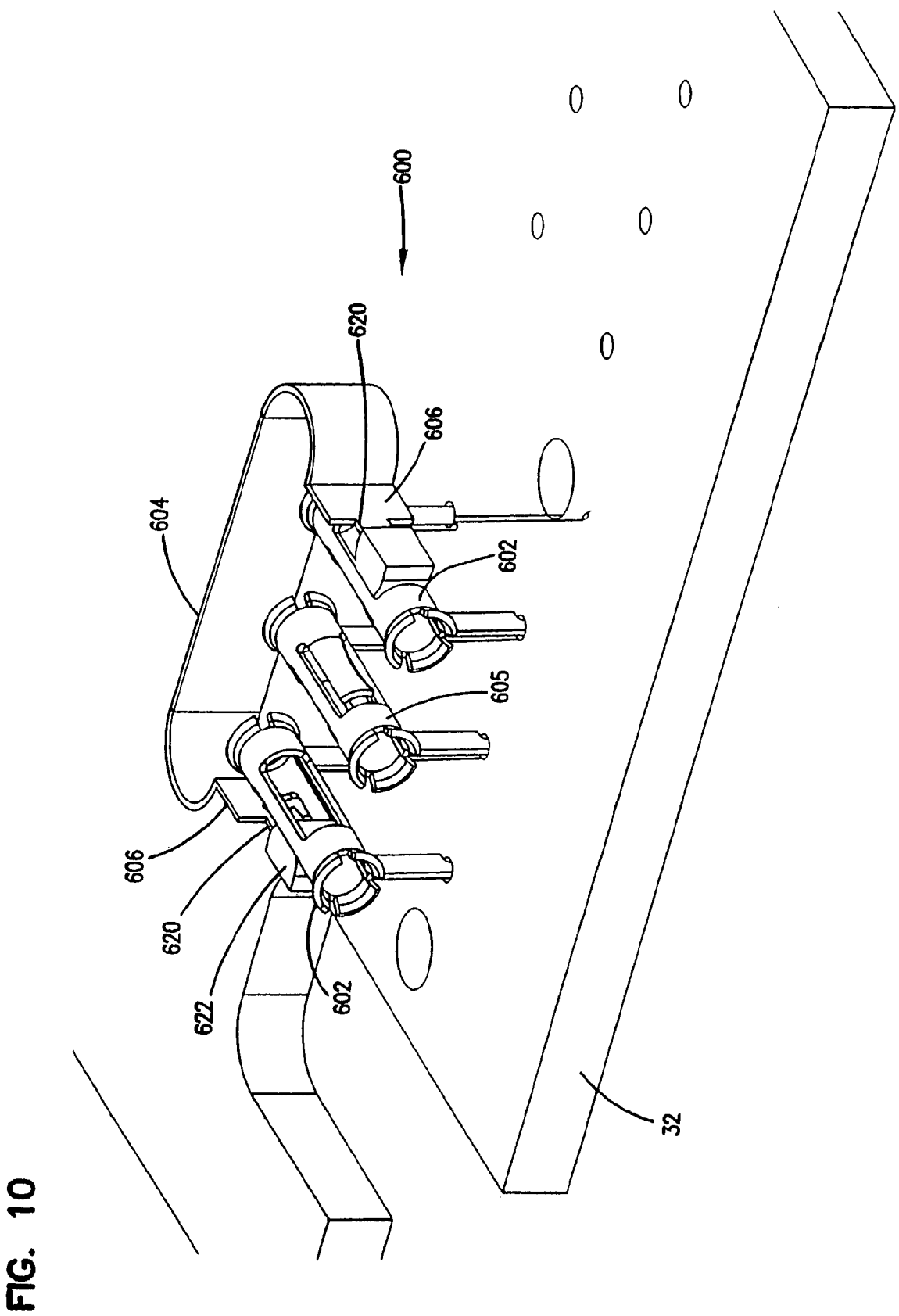
FIG. 10 is a perspective view of a fourth plug connector constructed in accordance with the principles of the present invention.
Figure 11:
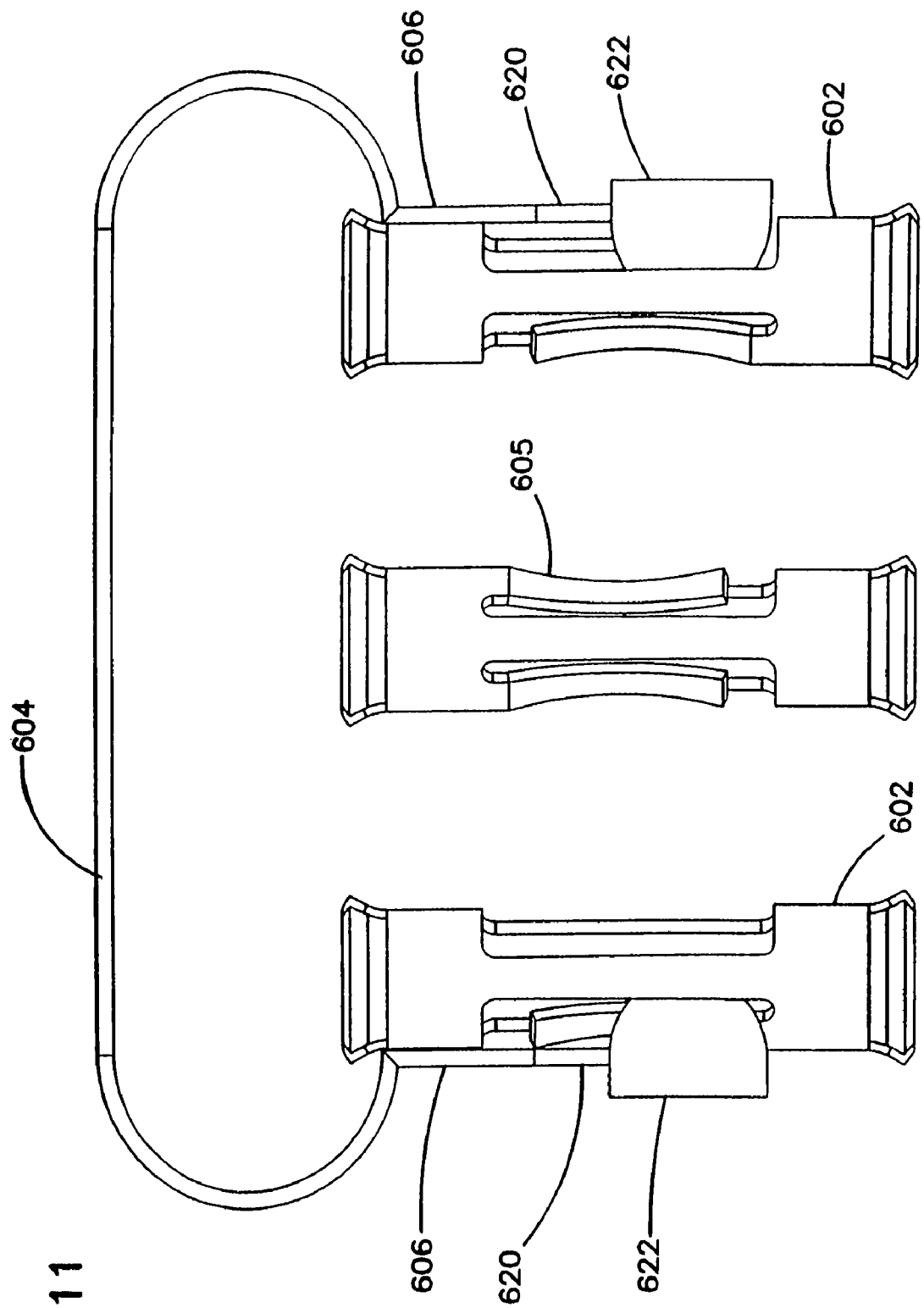
FIG. 11 is a top view of the plug connector of FIG. 10.

FIGS. 10 and 11 show another plug connector 600 constructed in accordance with the principles of the present invention. The plug connector 600 includes two through-sockets 602 and a grounding socket 605 positioned between the through-sockets 602. Similar to previous embodiments, the through-sockets 602 are preferably connected to their respective electrical components by tracings provided in circuit board 32. Also, grounding socket 605 is preferably grounded through circuit board 32. For clarity, the housing of the plug connector 600 has been omitted from FIGS. 10 and 11.

Referring still to FIGS. 10 and 11, the plug connector 600 includes a bypass spring 604 having contact regions 606 positioned adjacent the through-sockets 602. The bypass spring 604 is configured to normally bias the contact regions 606 against the outer surfaces of the through-sockets 602. Thus, when no attenuator plug is received within the plug connector 600, or when an attenuator is only partially received within the plug connector 600, the contact regions 606 are biased against the through sockets such that the bypass spring 604 forms a bypass pathway extending between the two through-sockets 602.

Referring again to FIGS. 10 and 11, the bypass spring 604 includes front projections 620 that project forwardly from the contact region 606. Dielectric camming members 622 are mounted on the front projections 620. The camming members 622 include portions that extend within the through-sockets 602 at an intermediate position along the lengths of the through-sockets 602. The dielectric camming projections 622 are positioned such that when an attenuator plug 34-1 is inserted within the plug connector 600, the through-pins 308 of the attenuator 34-1 engage the camming members 622 thereby forcing the camming members 622 radially outwardly. As the camming members 622 are forced radially outwardly, the contact regions 606 of the contact spring 604 are caused to disengage from the outer surface of the through-sockets 602 thereby breaking the electrical connection between the bypass spring 604 and the through-sockets 602. In such an orientation, signals provided to the plug connector 600 are routed through the attenuator plugged within the sockets 602 and 605.

As described above, the camming members 622 are preferably configured to disengage the contacts 606 from the through sockets 602 when an attenuator plug 34-1 is fully inserted within the plug connector 600. However, the camming members 622 are preferably positioned at intermediate positions along the lengths of the through-sockets 602. Thus, during removal of the attenuator plug, the ends of the through-pins 308 move past the camming members 622 thereby allowing the contact regions 606 of the bypass spring 604 to move into contact with the through sockets 602. Preferably, the camming members 622 are positioned such that when the through-pins 308 move past the camming members 622, the bypass spring 604 makes an electrical connection between the through sockets 602 before the electrical connection between the attenuator and the through sockets 604 is broken. This configuration prevents signals from being lost or interrupted during plug changing operations.

As used herein, the term "coax connector" will be understood to mean any type of connector adapted for use with a coaxial cable (e.g., connectors such as F-type or BNC connectors). Also, it will be appreciated that the various plug connector configurations shown in FIGS. 7A-7C, 8, 9A, 9B, 10 and 11 can be used in concert with any type of telecommunications equipment to prevent signal loss. For example, the various plug connector configurations could be used in the combiner module 110 of FIGS. 3 and 4 or in the equalizer 210 shown in FIGS. 5 and 6. Further, it is noted that while the plug connectors are preferably board mounted, the plug connectors can also be incorporated into systems/modules that are hard-wired or that use other types of electrical connecting techniques such as flexible circuits. Further, the various aspects of the present invention can be used in active as well as passive systems.

Figure 12A:
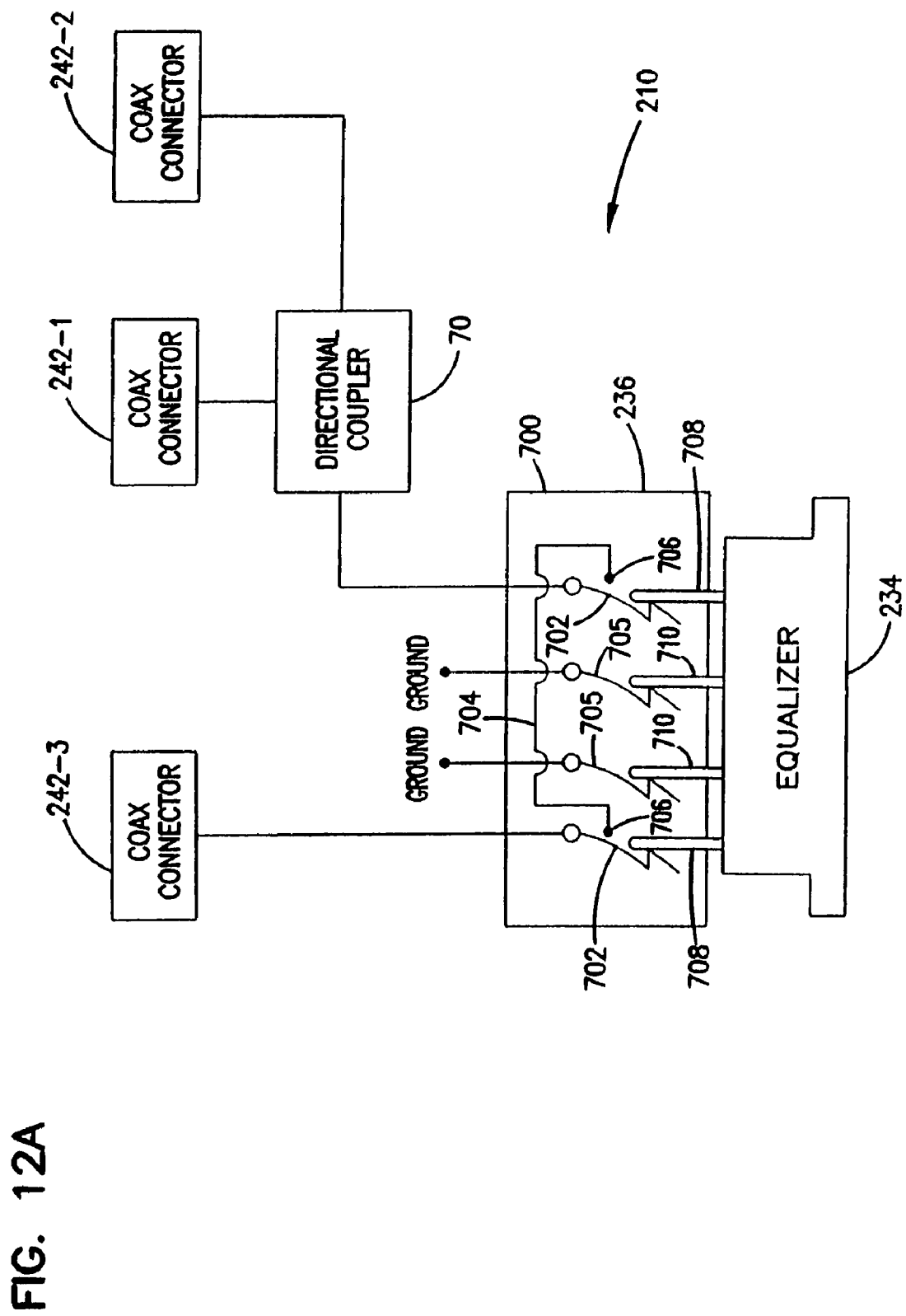
FIG. 12A schematically shows a portion of an equalizer having a fifth plug connector in accordance with the principles of the present invention, an equalizer plug is shown fully inserted within the plug connector.
Figure 12B:
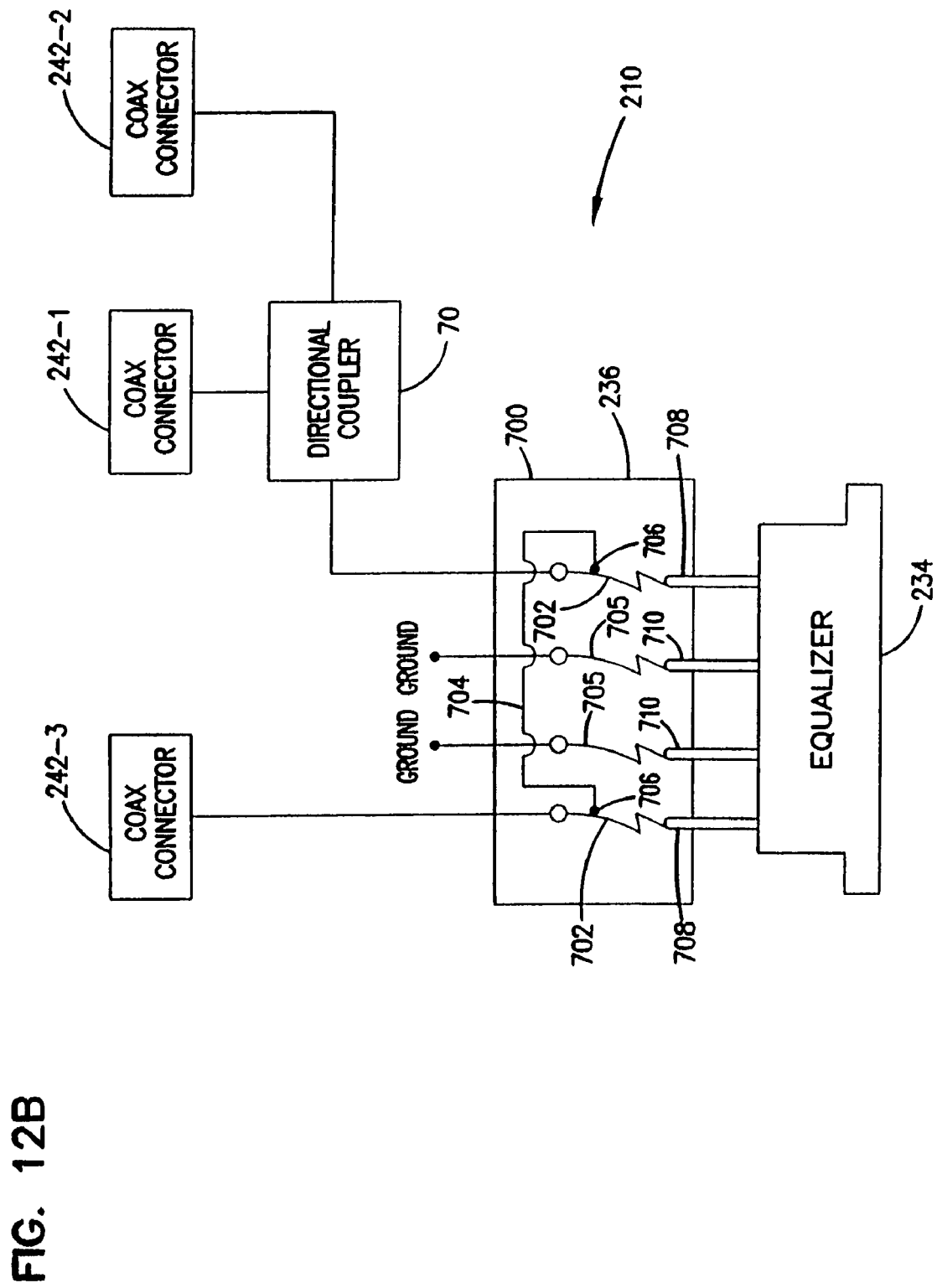
FIG. 12B schematically shows the equalizer of FIG. 12A with the plug partially removed from the plug connector.

FIGS. 12A and 12B schematically show a portion of the equalizing module 210 of FIGS. 5 and 6. Specifically, the coax connectors 242-1 to 242-3, the directional coupler 70 and the plug connector 236 of the module 210 are depicted. FIGS. 12A and 12B also schematically depict the equalizer 234. The equalizer 234 is shown including two through-pins 708 and two grounding pins 710.

Referring still to FIGS. 12A and 12B, the plug connector 236 includes a dielectric housing 700 sized for receiving the equalizer plug 234. Two through-springs 702 and two grounding springs 705 are mounted within the housing 700. One of the through-springs 702 is electrically connected to the coaxial connector 242-3, while the other through spring 702 is shown electrically connected to the directional coupler 70. Preferably, the through springs 702 are electrically connect to their respective components by tracings provided on the circuit board 232 (shown in FIG. 12). Additionally, the grounding springs 705 are preferably grounded through the circuit board 232.

Similar to previous embodiments, an electrical bypass-pathway 704 is preferably provided within the housing 700 between the two through-springs 702. The through-springs 702 are preferably normally biased against contact regions 706 of the bypass-pathway 704. Thus, when no plug is inserted within the plug connector 236, the bypass pathway 704 provides an electrical connection between the two through-springs 702 thereby allowing signals to be routed through the plug connector 236.

FIG. 12A shows the plug connector 236 with the equalizer 234 fully inserted therein. With the equalizer 234 so inserted, the through-pins 708 of the equalizer force the through-springs 702 of the plug connector 236 out of contact with their corresponding contact regions 706 of the bypass-pathway 704. Thus, with the equalizer 234 fully inserted within the plug connector 236, the circuit formed by the bypass-pathway 704 is open, and signals routed to the plug connector 236 are forced through the equalizer 234.

FIG. 12B shows the equalizer 234 at an intermediate position within the plug connector 236. At the intermediate position, the through-springs 702 remain in contact with the through-pins 708, the grounding springs 705 remain in contact with the grounding pin 710, and the through-springs 702 are biased into contact with the contact regions 706 of the bypass-pathway 704. With the plug 234 shown in the position of 12B, signals directed to the plug connector 234 will be routed through the lower resistance path defined by the bypass-pathway 704. Thus, the configuration of the through-springs 702 and the bypass-pathway 704 allows the signal to be routed through the bypass-pathway 704 before the connection is broken with the equalizer 234. This type of configuration prevents the signal from being interrupted when the equalizer 234 is removed from the plug connector 236.

The above specification, examples and data provide a complete description of the manufacture and use of the invention. Since many embodiments of the invention can be made without departing from the spirit and scope of the invention, the invention resides in the claims hereinafter appended.

What is claimed is:
1. A combiner module, comprising:
a) a housing having a front and a back;
b) rear connectors located at the back of the housing;
c) front connectors located at the front of the housing, each of the front connectors including a first spring contact and a second spring contact, each of the first and second spring contacts being electrically connected to one of the rear connectors;

d) attenuator plugs that plug into the front connectors, each attenuator plug including first and second pins that engage the first and second spring contacts of one front connector when plugged into the one front connector wherein signals entering the one front connector from the rear connectors are caused to be routed through the attenuator plug; and e) electrical by-pass circuits that each permit signals from the rear connectors to pass through an associated front connector in the absence of the attenuator plug.

2. The combiner module of claim 1, wherein the electrical by-pass circuits each electrically connect the first and second spring contacts of the associated front connector in the absence of the attenuator plug.

3. The combiner module of claim 1, wherein each front connector has a ground contact, and wherein each attenuator plug has three pins including the first and second pins that engage the first and second spring contacts and a ground pin that engages the ground contact of the front connector.

4. The combiner module of claim 1, wherein the combiner module is a 6-port combiner module including six front connectors.

5. The combiner module of claim 1, wherein the combiner module is an 8-port combiner module including eight front connectors.

6. The combiner module of claim 1, further including a printed circuit board disposed within the housing, the front connectors being mounted on a front edge of the printed circuit board.

7. The combiner module of claim 1, wherein each attenuator plug partly defines a first electrical circuit when the plug is fully plugged into the front connector, the first electrical circuit and the associated electrical by-pass circuit existing concurrently when the attenuation plug is partially removed from the front connector.

8. The combiner module of claim 1, wherein the spring contacts of the front connectors are normally biased to establish connection with the associated electrical by-pass circuit.

9. The combiner module of claim 1, wherein the rear connectors are coax connectors.

10. A combiner module, comprising:

a) a housing defining a plurality of attenuator plug ports;

b) attenuator plug connectors positioned within the housing adjacent the attenuator plug ports, each of the attenuator plug connectors including a first contact and a second contact;

c) a plurality of input coax connectors mounted to the housing;

d) an output coax connector mounted to the housing;

e) circuitry that electrically connects the input coax connectors to the output coax connector, the circuitry including a plurality of combiners and at least one directional coupler, the circuitry being routed through the attenuator plug connectors as the circuitry extends from the input coax connectors to the output coax connector;

f) attenuator plugs that plug into the attenuator plug connectors, each attenuator plug engaging both the first and second contacts of one attenuator plug connector when plugged into the one attenuator plug connector wherein signals entering the one attenuator plug connector from the input coax connectors are caused to be routed through the attenuator plug before being transmitted to the output coax connector; and g) electrical by-pass circuits that each permit signals from the input coax connectors to pass through an associated attenuator plug connector in the absence of the attenuator plug;

h) wherein the electrical by-pass circuits close before the attenuator plugs break contact with the first and second contacts during withdrawal of the attenuator plugs from the attenuator plug ports.

11. The combiner module of claim 10, wherein the housing includes a front side and a rear side, wherein the input and output coax connectors are positioned at the rear side, and wherein the attenuator plug ports are positioned at the front side.

12. The combiner module of claim 11, wherein the circuitry that electrically connects the input coax connectors to the output coax connector is provided on a circuit board positioned within the housing.

13. An equalizer module, comprising:

a) a housing having a front and a back;

b) rear connectors located at the back of the housing;

c) a front connector located at the front of the housing, the front connector including a first spring contact and a second spring contact, the first and second spring contacts being electrically connected to at least one of the rear connectors;

d) an equalizer plug that plugs into the front connector, the equalizer plug including first and second pins that engage the first and second spring contacts of the front connector when plugged into the front connector wherein signals entering the front connector from the rear connectors are caused to be routed through the equalizer plug; and e) an electrical by-pass circuit that permits signals from the rear connectors to pass through the front connector in the absence of the equalizer plug.

14. The equalizer module of claim 13, wherein the electrical by-pass circuit electrically connects the first and second spring contacts of the front connector in the absence of the equalizer plug.

15. The equalizer module of claim 13, wherein the front connector has a ground contact, and wherein the equalizer plug has three pins including the first and second pins that engage the first and second spring contacts and a ground pin that engages the ground contact of the front connector.

16. The equalizer module of claim 13, further including a printed circuit board disposed within the housing, the front connector being mounted on a front edge of the printed circuit board.

17. The equalizer module of claim 13, wherein the equalizer plug partly defines a first electrical circuit when the plug is fully plugged into the front connector, the first electrical circuit and the electrical by-pass circuit existing concurrently when the equalizer plug is partially removed from the front connector.

18. The equalizer module of claim 13, wherein the spring contacts of the front connector are normally biased to establish connection with the electrical by-pass circuit.

19. The equalizer module of claim 13, wherein the rear connectors are coax connectors.

20. An equalizer module, comprising:

a) a housing defining an equalizer plug port;

b) an equalizer plug connector positioned within the housing adjacent the equalizer plug port, the equalizer plug connector including a first contact and a second contact;

c) an input coax connector mounted to the housing;

d) an output coax connector mounted to the housing;

e) circuitry that electrically connects the input coax connector to the output coax connector, the circuitry including a directional coupler, the circuitry being routed through the equalizer plug connector as the circuitry extends from the input coax connector to the output coax connector;

f) an equalizer plug that plugs into the equalizer plug connector, the equalizer plug engaging both the first and second contacts of the equalizer plug connector when plugged into the equalizer plug connector wherein a signal entering the equalizer plug connector from the input coax connector is caused to be routed through the equalizer plug before being transmitted to the output coax connector; and g) an electrical by-pass circuit that permits a signal from the input coax connector to pass through the equalizer plug connector in the absence of the equalizer plug;

h) wherein the electrical by-pass circuit closes before the equalizer plug breaks contact with the first and second contacts during withdrawal of the equalizer plug from the equalizer plug port.

21. The equalizer module of claim 20, wherein the housing includes a front side and a rear side, wherein the input and output coax connectors are positioned at the rear side, and wherein the equalizer plug port is positioned at the front side.

22. The equalizer module of claim 21, wherein the circuitry that electrically connects the input coax connector to the output coax connector is provided on a circuit board positioned within the housing.

23. A combiner module, comprising:
a) a housing having a front and a back;
b) rear connectors located at the back of the housing;
c) front connectors located at the front of the housing, each of the front connectors including a first contact and a second contact, each of the first and second contacts being electrically connected to one of the rear connectors;
d) attenuator plugs that plug into the front connectors, each attenuator plug engaging both the first and second contacts of one front connector when plugged into the one front connector wherein signals entering the one front connector from the rear connectors are caused to be routed through the attenuator plug; and
e) electrical by-pass circuits that each permit signals from the rear connectors to pass through an associated front connector in the absence of the attenuator plug;
f) wherein each attenuator plug partly defines a first electrical circuit when the plug is fully plugged into the front connector, the first electrical circuit and the associated electrical by-pass circuit existing concurrently when the attenuation plug is partially removed from the front connector.

24. The combiner module of claim 23, wherein the electrical by-pass circuits each electrically connect the first and second contacts of the associated front connector in the absence of the attenuator plug.

25. The combiner module of claim 23, wherein each front connector has a ground contact, and wherein each attenuator plug has three pins including first and second pins that engage the first and second contacts and a ground pin that engages the ground contact of the front connector.

26. The combiner module of claim 23, wherein the combiner module is a 6-port combiner module including six front connectors.

27. The combiner module of claim 23, wherein the combiner module is an 8-port combiner module including eight front connectors.

28. The combiner module of claim 23, further including a printed circuit board disposed within the housing, the front connectors being mounted on a front edge of the printed circuit board.

29. The combiner module of claim 23, wherein the first and second contacts of the front connectors are sleeve-like sockets.

30. The combiner module of claim 23, wherein the rear connectors are coax connectors.

31. An equalizer module, comprising:
a) a housing having a front and a back;
b) rear connectors located at the back of the housing;
c) a front connector located at the front of the housing, the front connector including a first contact and a second contact, the first and second contacts being electrically connected to at least one of the rear connectors;
d) an equalizer plug that plugs into the front connector, the equalizer plug engaging both the first and second contacts of the front connector when plugged into the front connector wherein signals entering the front connector from the rear connectors are caused to be routed through the equalizer plug; and
e) an electrical by-pass circuit that permits signals from the rear connectors to pass through the front connector in the absence of the equalizer plug;
f) wherein the equalizer plug partly defines a first electrical circuit when the plug is fully plugged into the front connector, the first electrical circuit and the electrical by-pass circuit existing concurrently when the equalizer plug is partially removed from the front connector.

32. The equalizer module of claim 31, wherein the electrical by-pass circuit electrically connects the first and second contacts of the front connector in the absence of the equalizer plug.

33. The equalizer module of claim 31, wherein the front connector has a ground contact, and wherein the equalizer plug has three pins including first and second pins that engage the first and second contacts and a ground pin that engages the ground contact of the front connector.

34. The equalizer module of claim 31, further including a printed circuit board disposed within the housing, the front connector being mounted on a front edge of the printed circuit board.

35. The equalizer module of claim 31, wherein the rear connectors are coax connectors.

* * * * *